United States Patent
Uhm et al.

(10) Patent No.: US 10,998,381 B2
(45) Date of Patent: May 4, 2021

(54) SEMICONDUCTOR IMAGE SENSORS HAVING UPPER AND LOWER TRANSPARENT ELECTRODES THEREIN

(71) Applicant: Samsung Electronics Co., Ltd., Suwon-si (KR)

(72) Inventors: Sang Hoon Uhm, Hwaseong-si (KR); Ki Joong Yoon, Hwaseong-si (KR); Taek Soo Jeon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 199 days.

(21) Appl. No.: 16/281,519

(22) Filed: Feb. 21, 2019

(65) Prior Publication Data

US 2020/0119096 A1 Apr. 16, 2020

(30) Foreign Application Priority Data

Oct. 10, 2018 (KR) .................. 10-2018-0120409

(51) Int. Cl.
*H01L 29/08* (2006.01)
*H01L 27/30* (2006.01)
*H01L 51/44* (2006.01)
*H01L 27/146* (2006.01)

(52) U.S. Cl.
CPC .......... *H01L 27/307* (2013.01); *H01L 51/442* (2013.01); *H01L 27/1463* (2013.01); *H01L 27/14621* (2013.01); *H01L 27/14627* (2013.01); *H01L 27/14636* (2013.01); *H01L 27/14643* (2013.01)

(58) Field of Classification Search
CPC ............... H01L 27/307; H01L 51/442; H01L 27/14621; H01L 27/14636; H01L 27/14627; H01L 27/14643; H01L 27/1463; H01L 27/14612; H01L 27/14665; H01L 27/1464; H01L 27/14645; H01L 51/4206; Y02E 10/549
See application file for complete search history.

(56) References Cited

U.S. PATENT DOCUMENTS

| | | | |
|---|---|---|---|
| 8,368,784 B2 | 2/2013 | Yamaguchi | |
| 8,390,036 B2 | 3/2013 | Goto | |
| 9,087,761 B2* | 7/2015 | Otsuka | H01L 27/14623 |
| 9,196,851 B2 | 11/2015 | Park et al. | |
| 9,402,040 B2* | 7/2016 | Takase | H01L 27/14621 |
| 9,412,791 B2 | 8/2016 | Takahashi et al. | |
| 9,472,693 B2* | 10/2016 | Ihn | H01L 51/4253 |
| 9,490,441 B2 | 11/2016 | Takimoto | |

(Continued)

*Primary Examiner* — Caleb E Henry
(74) *Attorney, Agent, or Firm* — Myers Bigel, P.A.

(57) ABSTRACT

A semiconductor image sensor includes a substrate and an isolation insulating pattern having a trench therein, on the substrate. A lower transparent electrode is provided within the trench. This lower transparent electrode includes a first layer and a different second layer on the first layer. An organic photoelectric layer is provided on the lower transparent electrode, and an upper transparent electrode is provided on the organic photoelectric layer. The first layer may contact a bottom and a side surface of the trench, and may have a seam therein, which is at least partially filled by a portion of the second layer. The first layer may have a higher light transmission efficiency relative to the second layer and a lower electrical resistance relative to the second layer.

20 Claims, 10 Drawing Sheets

(56) References Cited

U.S. PATENT DOCUMENTS

| | | | |
|---|---|---|---|
| 9,667,877 B2* | 5/2017 | Aoki | H04N 5/238 |
| 9,674,461 B2* | 6/2017 | Aoki | G02B 3/0056 |
| 9,728,586 B2 | 8/2017 | Lee et al. | |
| 10,020,340 B2* | 7/2018 | Itahashi | H04N 5/378 |
| 10,522,581 B2* | 12/2019 | Lee | H04N 9/04 |
| 2007/0120045 A1 | 5/2007 | Yokoyama | |
| 2015/0188065 A1* | 7/2015 | Takimoto | H01L 27/14647 |
| | | | 257/40 |
| 2017/0170238 A1 | 6/2017 | Lee et al. | |

* cited by examiner

SEMICONDUCTOR IMAGE SENSORS HAVING UPPER AND LOWER TRANSPARENT ELECTRODES THEREIN

REFERENCE TO PRIORITY APPLICATION

This U.S. non-provisional patent application claims priority under 35 U.S.C. § 119 to Korean Patent Application No. 10-2018-0120409, filed Oct. 10, 2018, the disclosure of which is hereby incorporated herein by reference in its entirety.

BACKGROUND

1. Field

Devices and methods consistent with example embodiments relate to image sensors having transparent electrodes and methods of manufacturing the same.

2. Description of Related Art

Methods of forming organic photoelectric conversion elements have been utilized to manufacture image sensors that are highly integrated and highly efficient. Typically, an organic photoelectric conversion element requires a transparent electrode. Unfortunately, attempts to increase light transmission efficiency of the transparent electrode and improve electrical characteristics face various limitations.

SUMMARY

Example embodiments of the inventive concept include an image sensor that supports higher integration density and has excellent electrical characteristics, and methods of manufacturing the same. In some of these embodiments, an image sensor is provided, which includes a substrate and an isolation insulating pattern having a trench therein, on the substrate. A lower transparent electrode is provided within the trench. This lower transparent electrode includes a first layer and a different second layer on the first layer. An organic photoelectric layer is also provided on the lower transparent electrode, and an upper transparent electrode is provided on the organic photoelectric layer. In some embodiments, portions of the isolation insulating pattern, the first layer, and the second layer may be substantially coplanar with each other. In addition, the first layer may contact a bottom and a side surface of the trench. The first layer may include a seam therein extending adjacent a corner of the trench, and this seam may be at least partially filled by a portion of the second layer.

According to additional embodiments of the invention, the first layer may be configured to have a higher light transmission efficiency relative to the second layer and a lower electrical resistance relative to the second layer. The second layer may also include a material having a higher work function relative to the first layer. And, the second layer may contain a higher percentage of oxygen, by weight, relative to the first layer. For example, the first layer and the second layer may both include indium tin oxide (ITO), but with the indium tin oxide in the second layer having a higher percentage of oxygen therein relative to the first layer.

In further embodiments of the invention, the lower transparent electrode may include a third layer disposed on the first and second layers, and the third layer may contain a higher percentage of oxygen, by weight, relative to the second layer. Each of the first, second and third layers may be formed as indium tin oxide layers, and a portion of the third layer in direct contact with the first layer may be thicker than a portion of the third layer in direct contact with the second layer.

According to still further embodiments of the invention, a microlens may be provided on the upper transparent electrode. A photoelectric conversion element and a node region may also be provided at spaced-apart locations within the substrate. A color filter layer may be provided, which extends between the substrate and the isolation insulating pattern. A contact plug may be provided, which passes through the color filter layer and electrically connects the node region with the lower transparent electrode.

According to additional embodiments of the invention, there is provided a semiconductor device including an isolation insulating pattern having a trench and disposed on a substrate. A lower transparent electrode is disposed inside the trench. An organic photoelectric layer is disposed on the lower transparent electrode. An upper transparent electrode is disposed on the organic photoelectric layer. The lower transparent electrode includes a first layer and a second layer disposed on the first layer. Upper ends of the isolation insulating pattern, the first layer, and the second layer may be substantially coplanar with each other.

According to example embodiments, there is provided a semiconductor device including a photoelectric conversion element disposed in a substrate. An isolation insulating pattern having a trench is disposed on the photoelectric conversion element. A lower transparent electrode is disposed inside the trench. An organic photoelectric layer is disposed on the lower transparent electrode. An upper transparent electrode is disposed on the organic photoelectric layer. A microlens is disposed on the upper transparent electrode. The lower transparent electrode includes a first layer and a second layer disposed on the first layer. Upper ends of the isolation insulating pattern, the first layer, and the second layer are substantially coplanar with each other.

According to example embodiments, there is provided a semiconductor device including a plurality of photoelectric conversion elements disposed in a substrate. A plurality of node regions are disposed in the substrate and spaced apart from the plurality of photoelectric conversion elements. A color filter layer is disposed on the substrate. An isolation insulating pattern having a plurality of trenches is disposed on the color filter layer. A plurality of lower transparent electrodes are disposed inside the plurality of trenches. An organic photoelectric layer is disposed on the plurality of lower transparent electrodes. An upper transparent electrode is disposed on the organic photoelectric layer. A plurality of microlenses are disposed on the upper transparent electrode. Each of the plurality of lower transparent electrodes includes a first layer and a second layer disposed on the first layer. Upper ends of the isolation insulating pattern, the first layer, and the second layer are substantially coplanar with each other. Each of the plurality of lower transparent electrodes is connected to a corresponding one of the plurality of node regions through at least one contact plug disposed to pass through the color filter layer.

DETAILED DESCRIPTION OF EXEMPLARY EMBODIMENTS

Figure 1:
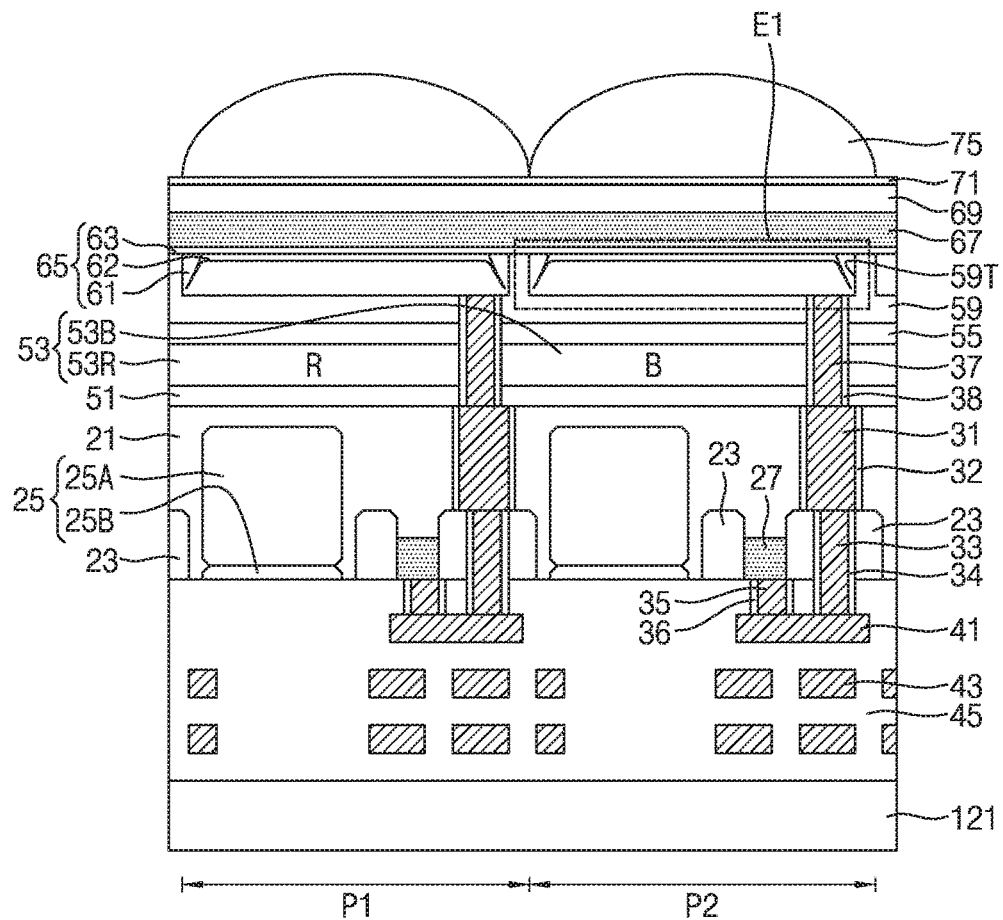
FIG. 1 is a cross-sectional view of a semiconductor image sensor according to an embodiment of the inventive concept.
Figure 2:
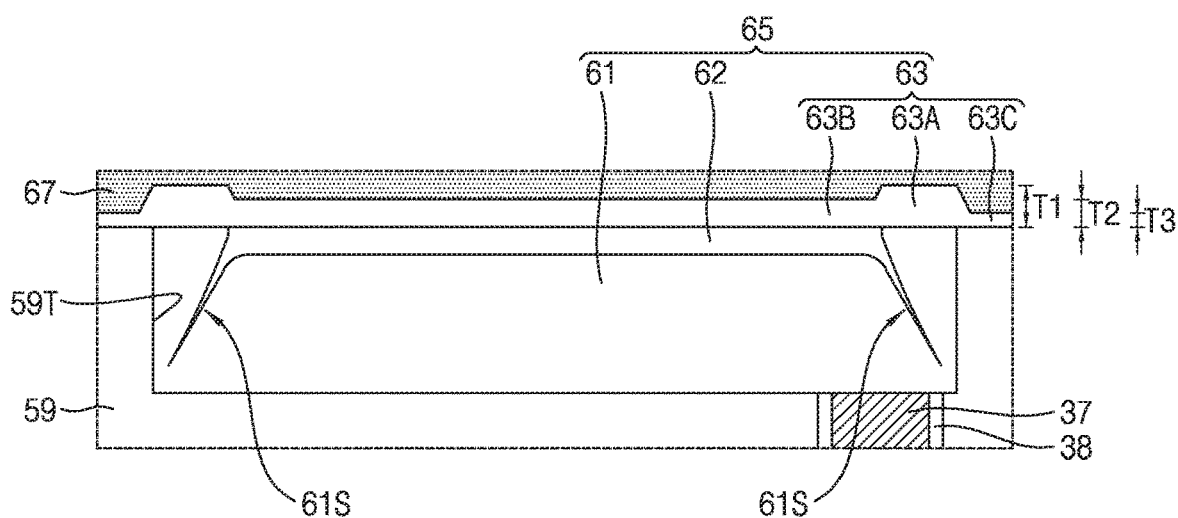
FIGS. 2 to 4 are enlarged cross-sectional views of portions of the image sensor of FIG. 1.
Figure 3:
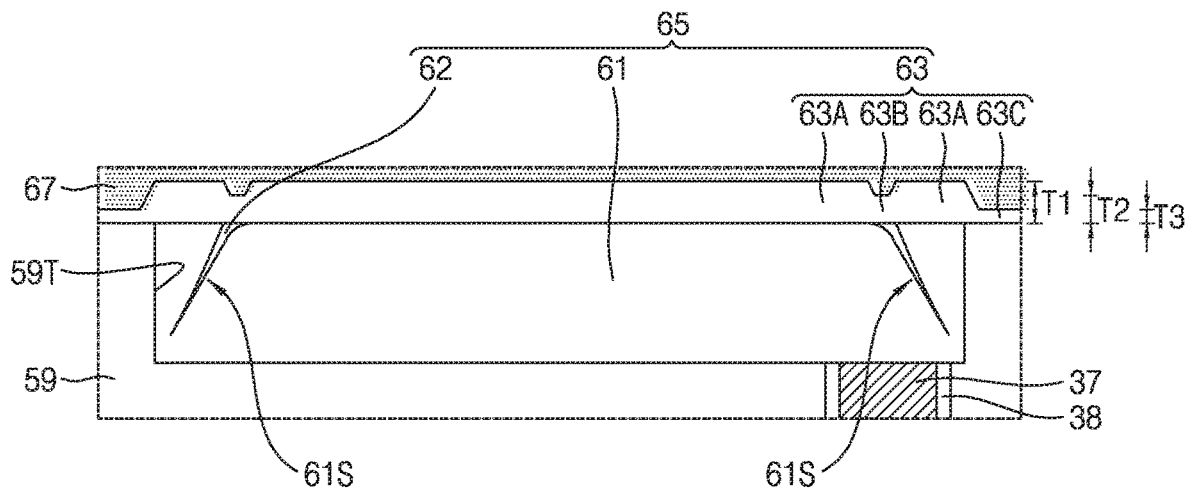
Figure 4:
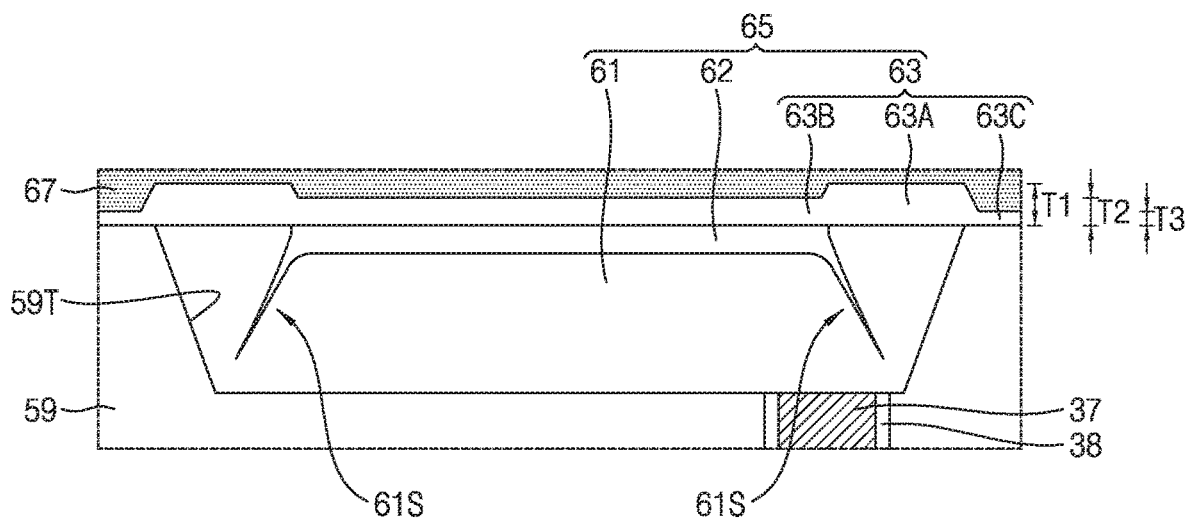

FIG. 1 is a cross-sectional view of a semiconductor device according to an embodiment of the inventive concept. FIGS. 2 to 4 are partial enlarged views illustrating a portion E1 of FIG. 1. The semiconductor device according to the embodiment of the inventive concept may include an image sensor such as a back-illuminated image sensor. In an embodiment, the semiconductor device may include a stack-type image sensor.

Referring to FIG. 1, the semiconductor device according to the embodiment of the inventive concept may include: a substrate 21, a plurality of pixel regions P1 and P2, a device isolation layer 23, a plurality of photoelectric conversion elements 25, a plurality of node regions 27, a plurality of first contact plugs 31, first contact spacers 32, a plurality of second contact plugs 33, second contact spacers 34, a plurality of third contact plugs 35, third contact spacers 36, a plurality of fourth contact plugs 37, fourth contact spacers 38, a plurality of first interconnection lines 41, a plurality of second interconnection lines 43, a first insulating layer 45, a second insulating layer 51, a color filter layer 53, a third insulating layer 55, an isolation insulating pattern 59, a plurality of trenches 59T, a plurality of lower transparent electrodes 65, an organic photoelectric layer 67, an upper transparent electrode 69, a fourth insulating layer 71, a plurality of microlenses 75, and a supplemental substrate 121.

The plurality of pixel regions P1 and P2 may include a first pixel region P1 and a second pixel region P2. Each of the plurality of photoelectric conversion elements 25 may include a first impurity region 25A and a second impurity region 25B. The color filter layer 53 may include a first color filter 53R and a second color filter 53B. In an embodiment, an opaque pattern may be disposed between the first color filter 53R and the second color filter 53B and/or disposed adjacent to the outside of the first color filter 53R and the second color filter 53B, but descriptions thereof will be omitted for brevity. When the opaque pattern (not shown) includes a conductive material, the plurality of fourth contact plugs 37 and the plurality of lower transparent electrodes 65 may be electrically insulated from the opaque pattern (not shown).

Each of the plurality of lower transparent electrodes 65 may include a first layer 61, a second layer 62, and a third layer 63. In an embodiment, the third layer 63 may be omitted. The plurality of photoelectric conversion elements 25 may be disposed in pixels configured to sense red light and blue light. For example, the first pixel region P1 may be a pixel configured to sense red light, whereas the second pixel region P2 may be a pixel configured to sense blue light. In an embodiment, the supplemental substrate 121 may further include various components such as a volatile memory, a non-volatile memory, a plurality of logic circuits, or a combination thereof.

The organic photoelectric layer 67 may include an organic material that absorbs light having a green wavelength and causes photoelectric conversion. The plurality of lower transparent electrodes 65, the organic photoelectric layer 67, and the upper transparent electrode 69 may constitute a plurality of organic photoelectric conversion elements 65, 67, and 69. Each of the plurality of organic photoelectric conversion elements 65, 67, and 69 may correspond to an organic photodiode.

Referring to FIG. 2, the lower transparent electrode 65 may include a first layer 61, a second layer 62, and a third layer 63. The first layer 61 and the second layer 62 may be formed inside the trench 59T. Upper ends of the isolation insulating pattern 59, the first layer 61, and the second layer 62 may be substantially coplanar with each other. The third layer 63 may cover the isolation insulating pattern 59, the first layer 61, and the second layer 62. The third layer 63 may protrude at a higher level than an upper end of the trench 59T.

The first layer 61 may be in direct contact with a bottom and a sidewall of the trench 59T. The first layer 61 may include at least one seam 61S. The at least one seam 61S may be formed adjacent to a lower corner of the trench 59T. The first layer 61 may be in direct contact with top surfaces of the fourth contact plug 37 and the fourth contact spacers 38. The first layer 61 may include a material layer having relatively higher light transmission efficiency and relatively lower electrical resistance than the second layer 62.

The second layer 62 may be formed on the first layer 61. The second layer 62 may fill the at least one seam 61S completely and densely. The first layer 61 may surround a side surface and a bottom of the second layer 62. The first layer 61 may be in direct contact with a side surface and a bottom of the second layer 62. The second layer 62 may have a smaller thickness than the first layer 61. The second layer 62 may include a material layer having a better gap-filling characteristic and a larger work function than the first layer 61. The second layer 62 may include a material layer having relatively lower light transmission efficiency and relatively higher electrical resistance than the first layer 61. The second layer 62 may contain a higher percent by weight (wt %) of oxygen than the first layer 61.

The third layer 63 may be in direct contact with top surfaces of the isolation insulating pattern 59, the first layer 61, and the second layer 62. The third layer 63 may include a first portion 63A in direct contact with the first layer 61, a second portion 63B in direct contact with the second layer 62, and a third portion 63C in direct contact with the isolation insulating pattern 59. The first portion 63A, the second portion 63B, and the third portion 63C may each have different thicknesses. The first portion 63A may have a first thickness T1, the second portion 63B may have a second thickness T2, and the third portion 63C may have a third thickness T3. The second thickness T2 may be greater than the third thickness T3. The first thickness T1 may be greater than the second thickness T2. The third layer 63 may have a smaller thickness than the first layer 61.

The third layer 63 may have a larger work function than the second layer 62. The third layer 63 may include a material layer having relatively lower light transmission efficiency and relatively higher electrical resistance than the second layer 62. A percent by weight (wt %) of oxygen in the third layer 63 may be higher than that in the second layer 62 and the first layer 61. The third layer 63 may be an insulating layer.

In an embodiment, the third portion 63C may include a different material from the first portion 63A and the second portion 63B. The third portion 63C may include an insulating layer such as a silicon oxide layer. The third portion 63C may be omitted.

Referring back to FIGS. 1 and 2, the plurality of photoelectric conversion elements 25 and the plurality of node regions 27 may be disposed in the substrate 21. Each of the plurality of node regions 27 may be disposed adjacent to a corresponding one of the plurality of photoelectric conversion elements 25. Each of the plurality of node regions 27 may be spaced apart from the plurality of photoelectric conversion elements 25. The color filter layer 53 may be disposed on the substrate 21. Each of the first color filter 53R and the second color filter 53B may overlap a corresponding one of the plurality of photoelectric conversion elements 25. The isolation insulating pattern 59 having the plurality of trenches 59T may be disposed on the color filter layer 53. The plurality of lower transparent electrodes 65 may fill the plurality of trenches 59T and cover the isolation insulating pattern 59. In an embodiment, the plurality of lower transparent electrodes 65 may be defined inside the plurality of trenches 59T. The organic photoelectric layer 67 may be disposed on the plurality of lower transparent electrodes 65. The upper transparent electrode 69 may be disposed on the organic photoelectric layer 67. The plurality of microlenses 75 may be disposed on the upper transparent electrode 69.

The plurality of first contact plugs 31, the plurality of second contact plugs 33, the plurality of third contact plugs 35, and the plurality of fourth contact plugs 37 may be referred to as a plurality of contact plugs 31, 33, 35, and 37. Each of the plurality of lower transparent electrodes 65 may be electrically connected to a corresponding one of the plurality of node regions 27 through the plurality of contact plugs 31, 33, 35, and 37 and the plurality of first interconnection lines 41.

The organic photoelectric layer 67 may absorb light, generate holes and electrons, and separately transmit the holes and the electrons. Electrons generated by the organic photoelectric layer 67 may pass through the lower transparent electrode 65 and be transmitted to the node region 27. Holes generated by the organic photoelectric layer 67 may be transmitted to the upper transparent electrode 69. The organic photoelectric layer 67 may include an organic material that selectively causes photoelectric conversion for light having a specific wavelength (or range of wavelengths). The color filter layer 53 may selectively transmit light having a different wavelength than the specific wavelength of the organic photoelectric layer 67.

Each of the second layer 62 and the third layer 63 may have a larger work function than the first layer 61. The second layer 62 and the third layer 63 may increase a work function of the lower transparent electrode 65, and the quantum efficiency (QE) of the plurality of organic photoelectric conversion elements 65, 67, and 69 may be significantly increased. The second layer 62 may fill the at least one seam 61S completely and densely. Light transmission efficiency of the lower transparent electrode 65 may be markedly increased. Signal-to-noise ratios (SNRs) of the plurality of organic photoelectric conversion elements 65, 67, and 69 may be increased.

Referring to FIG. 3, the lower transparent electrode 65 may include a first layer 61, a second layer 62, and a third layer 63. In a central region of the trench 59T, the first layer 61 may be in direct contact with the third layer 63. The second layer 62 may fill at least one seam 61S completely and densely.

Figure 5:
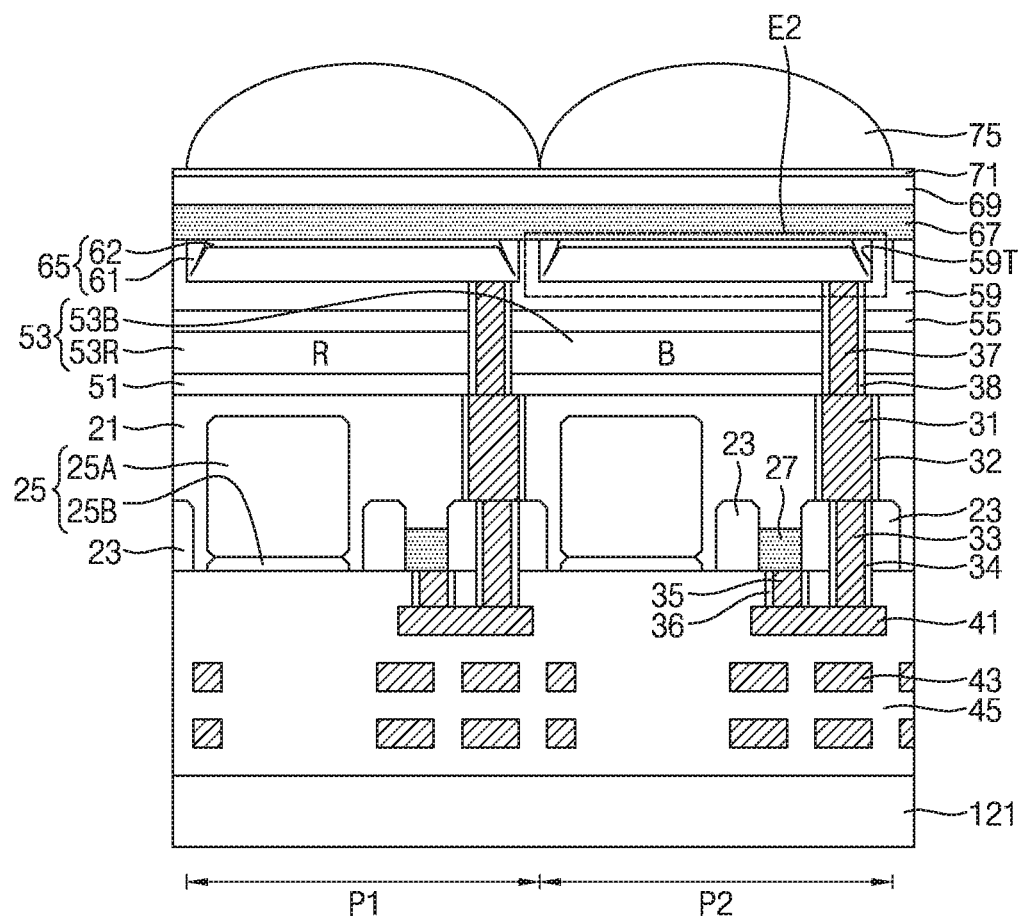
FIG. 5 is a cross-sectional view of a semiconductor image sensor according to an embodiment of the inventive concept.

Referring to FIG. 4, the isolation insulating pattern 59 may include inclined side surfaces. The sidewall of the trench 59T may exhibit various inclinations. FIG. 5 is a cross-sectional view illustrating a semiconductor device according to an embodiment of the inventive concept, and FIGS. 6 and 7 are partial enlarged views of a portion E2 of FIG. 5.

Referring to FIG. 5, each of a plurality of lower transparent electrodes 65 may include a first layer 61 and a second layer 62. Upper ends of the isolation insulating pattern 59, the first layer 61, and the second layer 62 may be substantially coplanar with each other. An organic photoelectric layer 67 may be formed on the isolation insulating pattern 59, the first layer 61, and the second layer 62.

Figure 6:
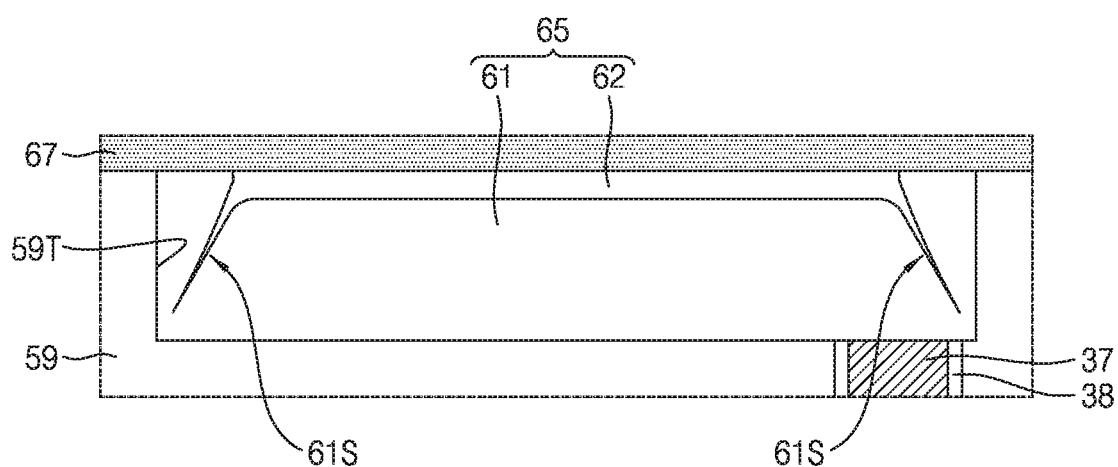
FIGS. 6 and 7 are enlarged views illustrating respective portions of the image sensor of FIG. 5.

Referring to FIG. 6, upper ends of the isolation insulating pattern 59, the first layer 61, and the second layer 62 may be substantially coplanar with each other. The organic photoelectric layer 67 may be in direct contact with top surfaces of the isolation insulating pattern 59, the first layer 61, and the second layer 62.

Figure 7:
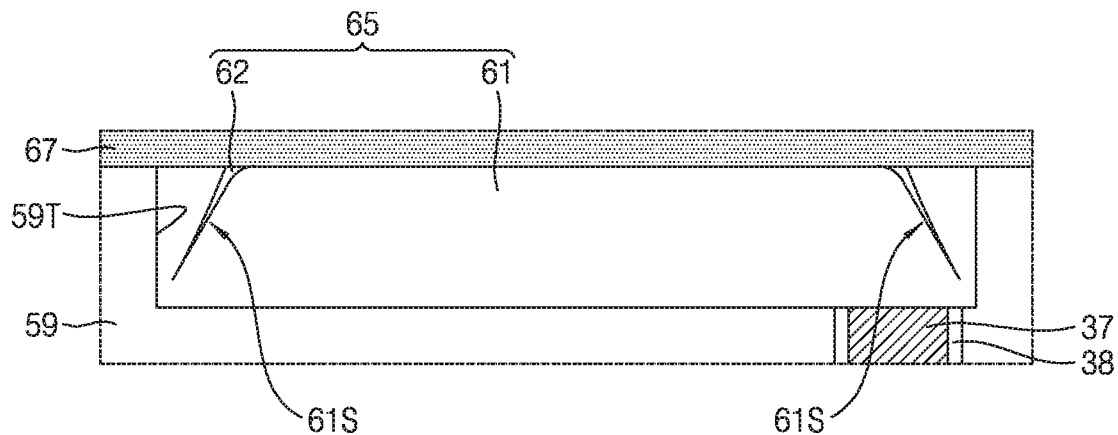

Referring to FIG. 7, in the central region of the trench 59T, the first layer 61 may be in direct contact with the organic photoelectric layer 67. The second layer 62 may fill at least one seam 61S completely and densely.

Figure 8:
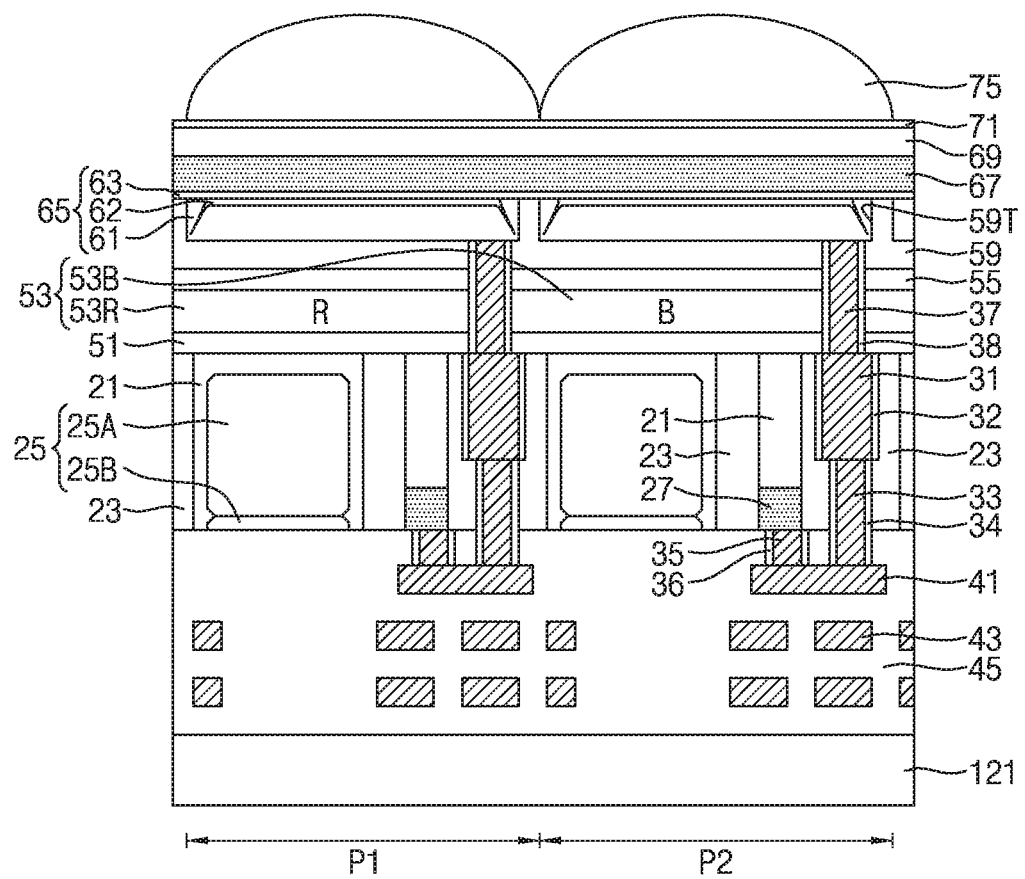
FIGS. 8 to 10 are cross-sectional views illustrating semiconductor image sensors according to embodiments of the inventive concept.
Figure 9:
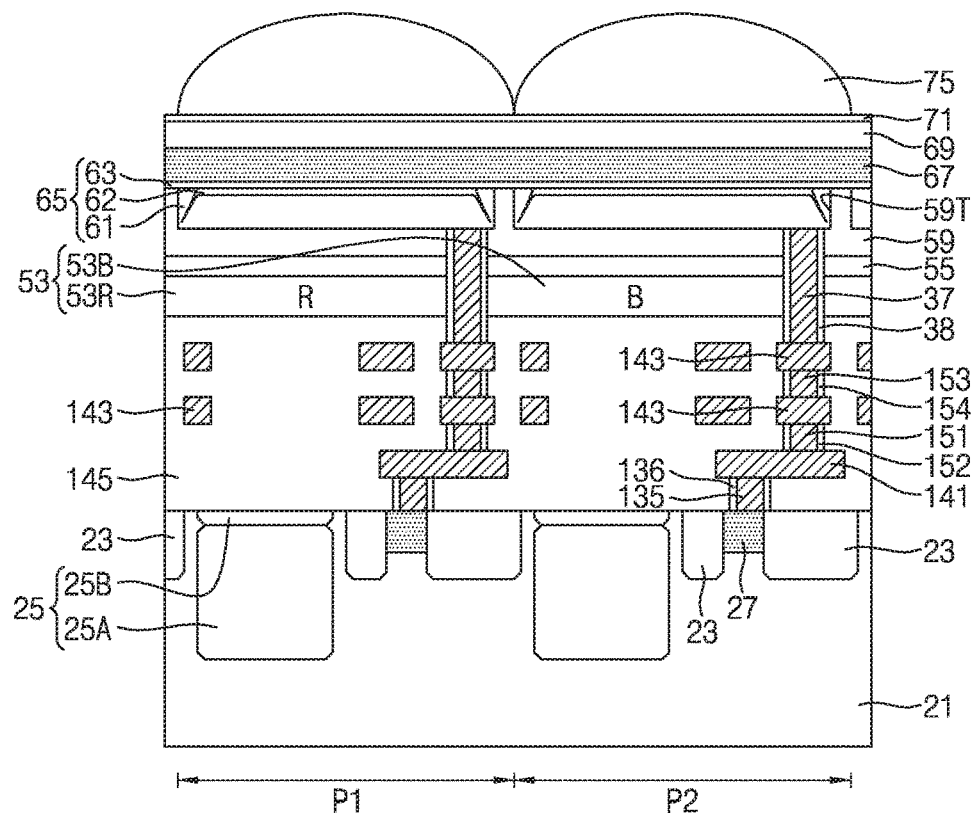
Figure 10:
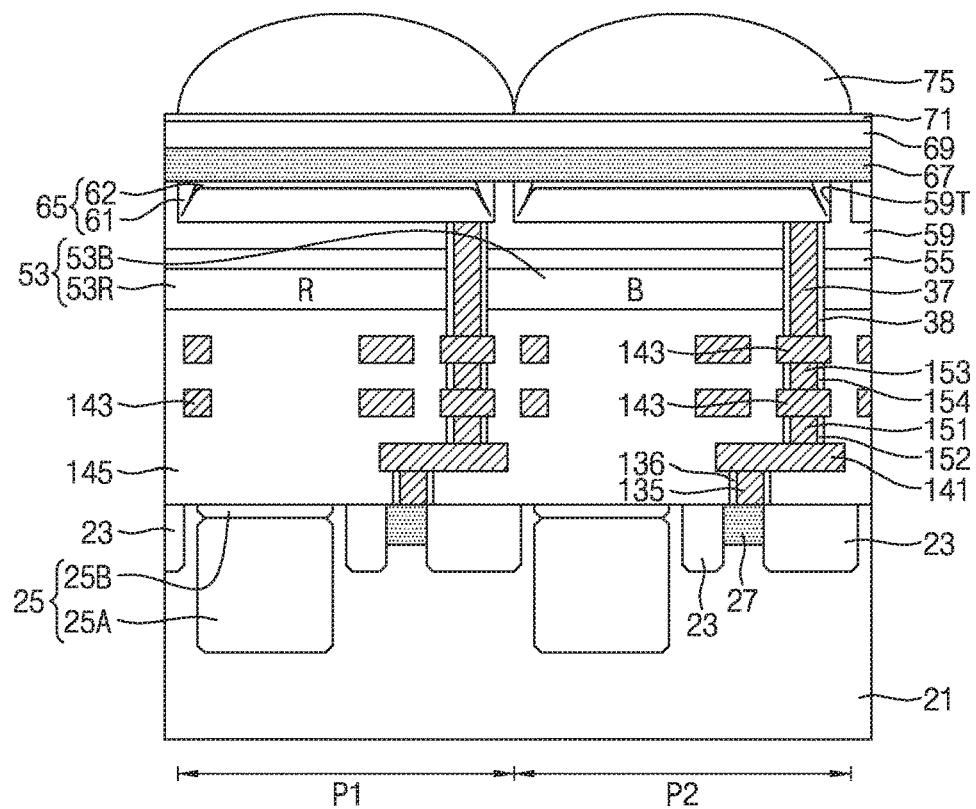

FIGS. 8 to 10 are cross-sectional views illustrating a semiconductor device according to an embodiment of the inventive concept.

Referring to FIG. 8, a device isolation layer 23 may completely pass through a substrate 21. A plurality of first contact plugs 31, first contact spacers 32, a plurality of second contact plugs 33, and second contact spacers 34 may pass through the device isolation layer 23.

Referring to FIG. 9, the semiconductor device according to the embodiment of the inventive concept may include a substrate 21, a plurality of pixel regions P1 and P2, a device isolation layer 23, a plurality of photoelectric conversion elements 25, a plurality of node regions 27, a plurality of first contact plugs 151, first contact spacers 152, a plurality of second contact plugs 153, second contact spacers 154, a plurality of third contact plugs 135, third contact spacers 136, a plurality of fourth contact plugs 37, fourth contact spacers 38, a plurality of first interconnection lines 141, a plurality of second interconnection lines 143, a first insulating layer 145, a color filter layer 53, a third insulating layer 55, an isolation insulating pattern 59, a plurality of trenches 59T, a plurality of lower transparent electrodes 65, an organic photoelectric layer 67, an upper transparent electrode 69, a fourth insulating layer 71, and a plurality of microlenses 75. Each of the plurality of lower transparent electrodes 65 may include a first layer 61, a second layer 62, and a third layer 63.

Referring to FIG. 10, each of the plurality of lower transparent electrodes 65 may include the first layer 61 and the second layer 62. FIGS. 11 to 18 are cross-sectional views illustrating methods of manufacturing semiconductor devices according to embodiments of the inventive concept.

Figure 11:
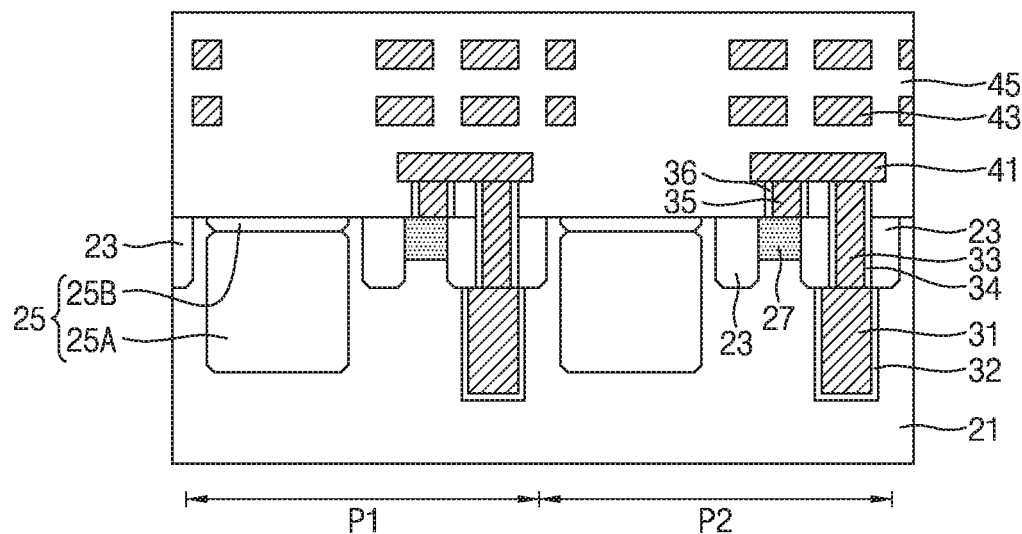
FIGS. 11 to 18 are cross-sectional views illustrating methods of manufacturing semiconductor image sensors according to embodiments of the inventive concept.

Referring to FIG. 11, a device isolation layer 23 may be formed in a substrate 21 having a plurality of pixel regions P1 and P2. A plurality of photoelectric conversion elements 25, a plurality of node regions 27, a plurality of first contact plugs 31, and first contact spacers 32 may be formed in the substrate 21. Each of the plurality of photoelectric conversion elements 25 may include a first impurity region 25A and a second impurity region 25B. Each of the plurality of photoelectric conversion elements 25 and the plurality of node regions 27 may be defined in the substrate 21 by the device isolation layer 23. Each of the plurality of node regions 27 may be electrically isolated from the plurality of photoelectric conversion elements 25. A plurality of second contact plugs 33, second contact spacers 34, a plurality of third contact plugs 35, third contact spacers 36, a plurality of first interconnection lines 41, a plurality of second interconnection lines 43, and a first insulating layer 45 may be formed on the substrate 21.

The substrate 21 may include a semiconductor substrate such as a silicon wafer. For example, the substrate 21 may be a P-type single crystalline wafer. The plurality of pixel regions P1 and P2 may include a first pixel region P1 and a second pixel region P2. The first impurity region 25A and the second impurity region 25B may be formed in the substrate 21 using an ion implantation process. The first impurity region 25A and the second impurity region 25B may have different conductivity types. For example, the first impurity region 25A may be doped with N-type impurities, while the second impurity region 25B may be doped with P-type impurities. The second impurity region 25B may be in direct contact with the first impurity region 25A. The second impurity region 25B may be formed closer to a surface of the substrate 21 than the first impurity region 25A. The first impurity region 25A may be relatively thicker than the second impurity region 25B.

The plurality of node regions 27 may be formed in the substrate 21 using an ion implantation process. The plurality of node regions 27 may have a different conductivity type from the substrate 21. For example, the plurality of node regions 27 may be doped with N-type impurities.

The device isolation layer 23 may be formed using a trench isolation technique, such as a shallow trench isolation (STI) technique. The first insulating layer 45 may cover one surface of the substrate 21. Each of the device isolation layer 23 and the first insulating layer 45 may include silicon oxide, silicon nitride, silicon oxynitride, a low-k dielectric, a high-k dielectric, or a combination thereof, for example.

The plurality of first contact plugs 31 and the first contact spacers 32 may be formed to partially pass through the substrate 21 under the device isolation layer 23. The first contact spacers 32 may surround side surfaces of the plurality of first contact plugs 31. Each of the plurality of first contact plugs 31 may correspond to a through-silicon via (TSV). The plurality of second contact plugs 33 may partially pass through the first insulating layer 45, pass through the device isolation layer 23, and be in contact with the plurality of first contact plugs 31. The second contact spacers 34 may surround side surfaces of the plurality of second contact plugs 33. The plurality of third contact plugs 35 may partially pass through the first insulating layer 45 and be in contact with the plurality of node regions 27. The third contact spacers 36 may surround side surfaces of the plurality of third contact plugs 35. The plurality of first interconnection lines 41 may be formed in the first insulating layer 45 and be in contact with the plurality of second contact plugs 33 and the plurality of third contact plugs 35. The plurality of second interconnection lines 43 may be formed in the first insulating layer 45.

Each of the plurality of first contact plugs 31, the plurality of second contact plugs 33, the plurality of third contact plugs 35, the plurality of first interconnection lines 41, and the plurality of second interconnection lines 43 may include a conductive layer including a metal, a metal nitride, a metal silicide, polysilicon, conductive carbon, or a combination thereof. Each of the first contact spacers 32, the second contact spacers 34, and the third contact spacers 36 may include silicon oxide, silicon nitride, silicon oxynitride, a low-k dielectric, a high-k dielectric, or a combination thereof, for example.

Figure 12:
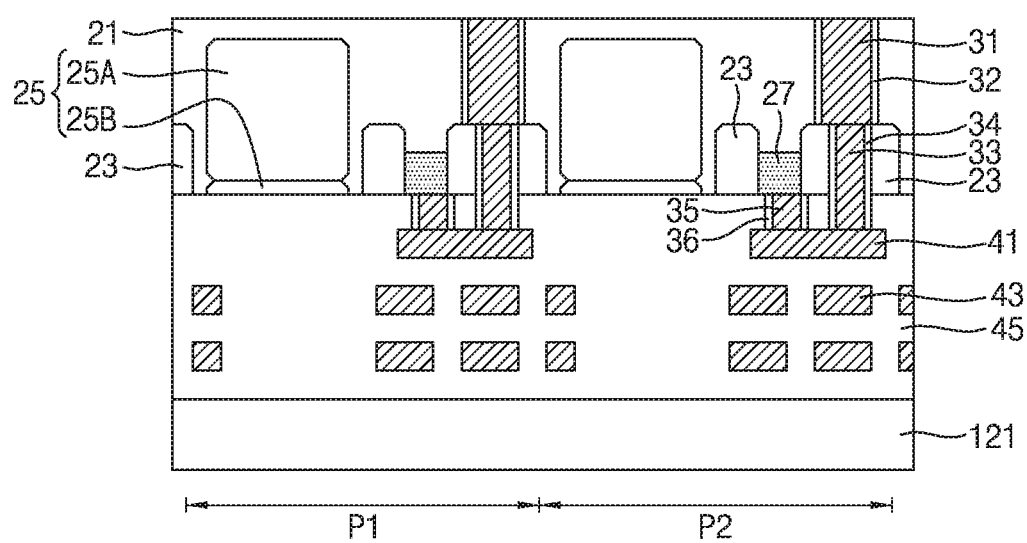

Referring to FIG. 12, a supplemental substrate 121 may be adhered to and disposed on the first insulating layer 45. A rear surface of the substrate 21 may be partially removed to expose the plurality of first contact plugs 31. The supplemental substrate 121 may prevent damage to the substrate 21.

Figure 13:
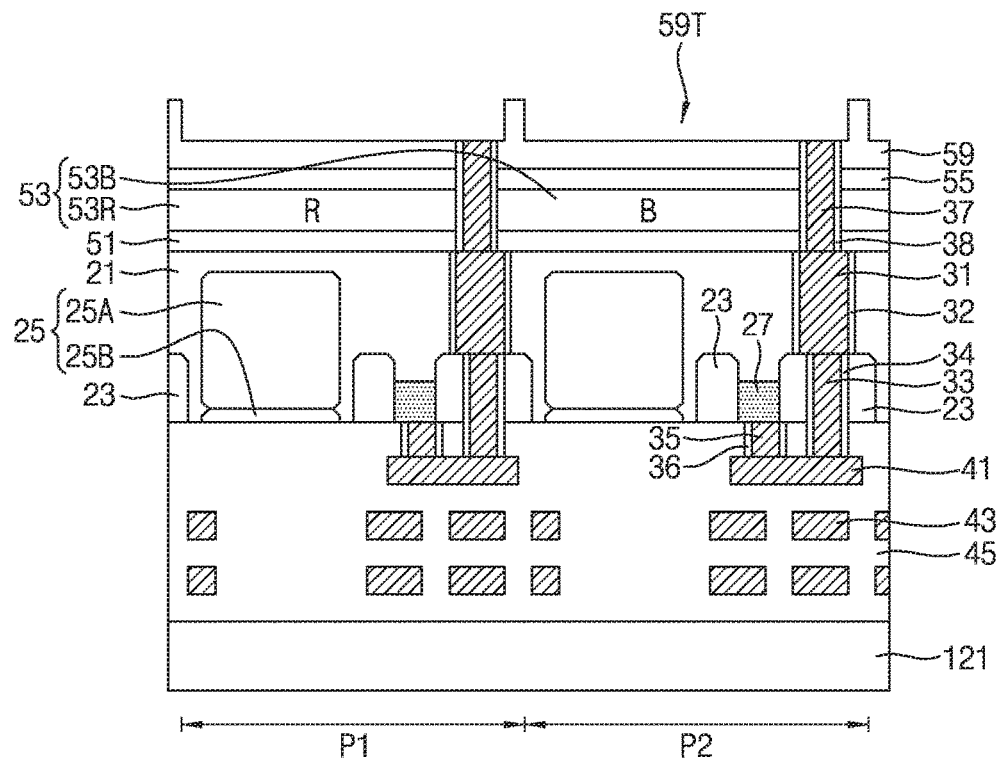

Referring to FIG. 13, a second insulating layer 51 may be formed to cover the substrate 21 and the plurality of first contact plugs 31. A color filter layer 53 may be formed on the second insulating layer 51. The color filter layer 53 may include a first color filter 53R and a second color filter 53B. A third insulating layer 55 may be formed on the color filter layer 53. An isolation insulating pattern 59 having a plurality of trenches 59T may be formed on the third insulating layer 55. A plurality of fourth contact plugs 37 may be formed to pass through the isolation insulating pattern 59, the third insulating layer 55, the color filter layer 53, and the second insulating layer 51 and be in contact with the plurality of first contact plugs 31. Fourth contact spacers 38 may be formed on side surfaces of the plurality of fourth contact plugs 37. The fourth contact spacers 38 may surround the side surfaces of the plurality of fourth contact plugs 37.

Each of the second insulating layer 51 and the third insulating layer 55 may include silicon oxide, silicon nitride, silicon oxynitride, a low-k dielectric, a high-k dielectric, or a combination thereof. In an embodiment, the second insulating layer 51 may include an anti-reflection layer (ARL). For example, the second insulating layer 51 may include silicon oxynitride (SiON), silicon carbide (SiC), silicon carbonitride (SiCN), silicon oxycarbide (SiCO), or a combination thereof. The third insulating layer 55 may correspond to a planarization layer or a coating layer. For example, the third insulating layer 55 may include a transparent organic material.

The color filter layer 53 may selectively transmit light having a specific wavelength. The first color filter 53R may be a red filter and be formed in the first pixel region P1. The second color filter 53B may be a blue filter and be formed in the second pixel region P2. In an embodiment, the first color filter 53R may selectively transmit light having a wavelength corresponding to red. The second color filter 53B may selectively transmit light having a wavelength corresponding to blue. Each of the first color filter 53R and the second color filter 53B may overlap a corresponding one of the plurality of photoelectric conversion elements 25.

The isolation insulating pattern 59 may include a transparent insulating layer such as a silicon oxide layer. Each of the plurality of trenches 59T may overlap a corresponding one of the plurality of pixel regions P1 and P2. The plurality of fourth contact plugs 37 may be exposed at bottoms of the plurality of trenches 59T. The plurality of fourth contact plugs 37 may include a conductive layer, including a metal, a metal nitride, a metal silicide, polysilicon, conductive carbon, or a combination thereof. The fourth contact spacer 38 may include silicon oxide, silicon nitride, silicon oxynitride, a low-k dielectric, a high-k dielectric, or a combination thereof.

Figure 14:
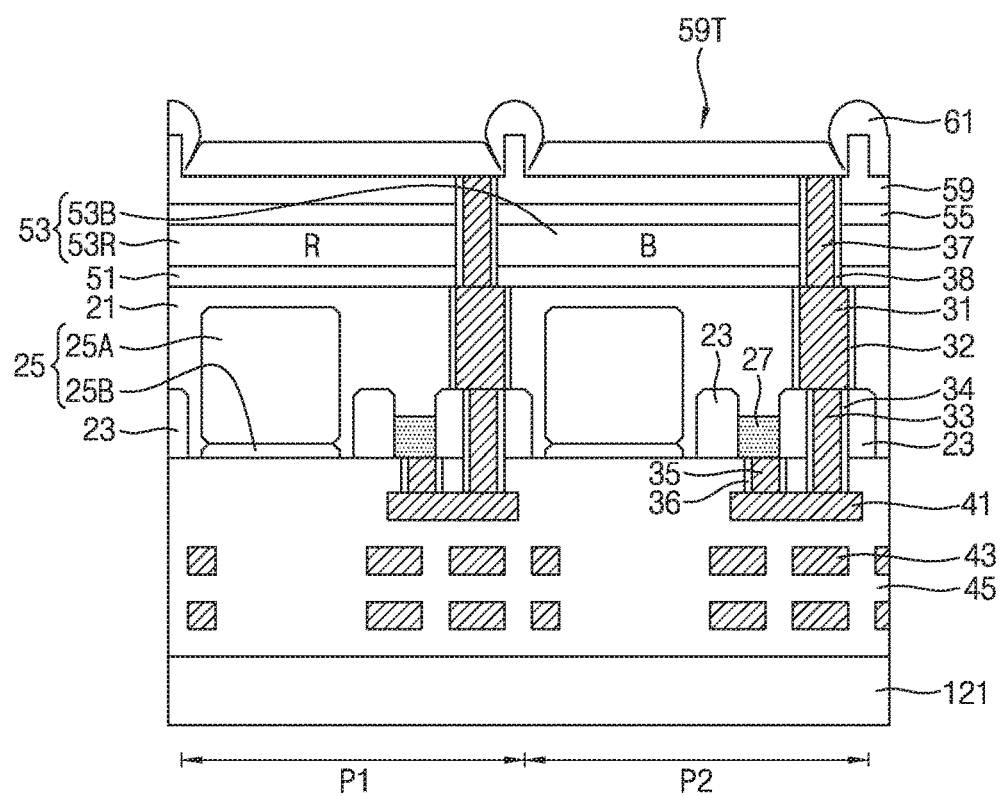

Referring to FIG. 14, a first layer 61 may be formed on the isolation insulating pattern 59. The first layer 61 may cover bottoms and sidewalls of the plurality of trenches 59T. The first layer 61 may include at least one seam 61S as described with reference to FIG. 2.

The first layer 61 may include a conductive oxide such as indium tin oxide (ITO), indium zinc oxide (IZO), zinc oxide (ZnO), tin oxide (SnO), titanium oxide (TiO), aluminum (AD-doped zinc oxide (AZO), gallium (Ga)-doped zinc oxide (GZO), fluorine (F)-doped tin oxide (FTO), antimony (Sb)-doped tin oxide (ATO), or a combination thereof. In an embodiment, the first layer 61 may be formed using a physical vapor deposition (PVD) method. For example, the first layer 61 may include indium tin oxide (ITO) obtained using a PVD method.

Figure 15:
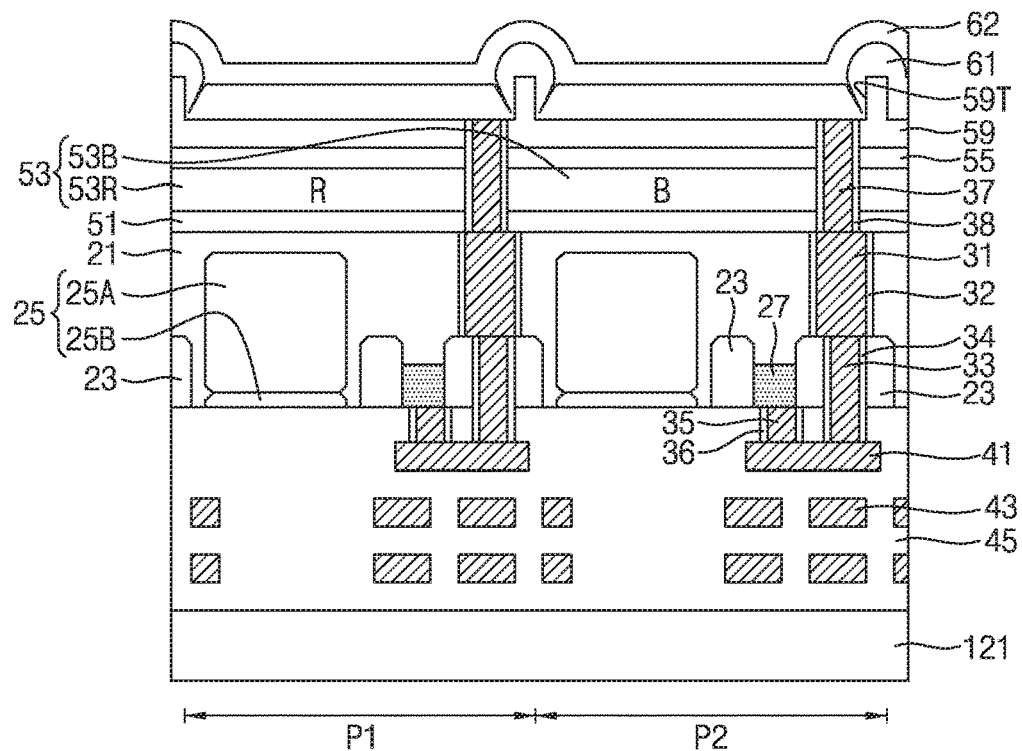

Referring to FIG. 15, a second layer 62 may be formed on the first layer 61. The second layer 62 may be formed on a surface of the first layer 61 and completely fill the plurality of trenches 59T. The second layer 62 may fill the at least one seam 61S completely and densely as described with reference to FIG. 2. The second layer 62 may be in direct contact with a top surface of the first layer 61. The process of forming the second layer 62 and the first layer 61 may be performed in-situ.

The second layer 62 may be formed using a PVD method, a chemical vapor deposition (CVD) method, an atomic layer deposition (ALD) method, or a combination thereof. A partial pressure of oxygen ($O_2$) in the process of forming the second layer 62 may be higher than that in the process of forming the first layer 61. In an embodiment, the second layer 62 may include the same elements as the first layer 61 and contain a higher percent by weight (wt %) of oxygen than the first layer 61. For example, the first layer 61 may include indium tin oxide (ITO), and the second layer 62 may include ITO containing a higher percent by weight (wt %) of oxygen than the first layer 61.

Figure 16:
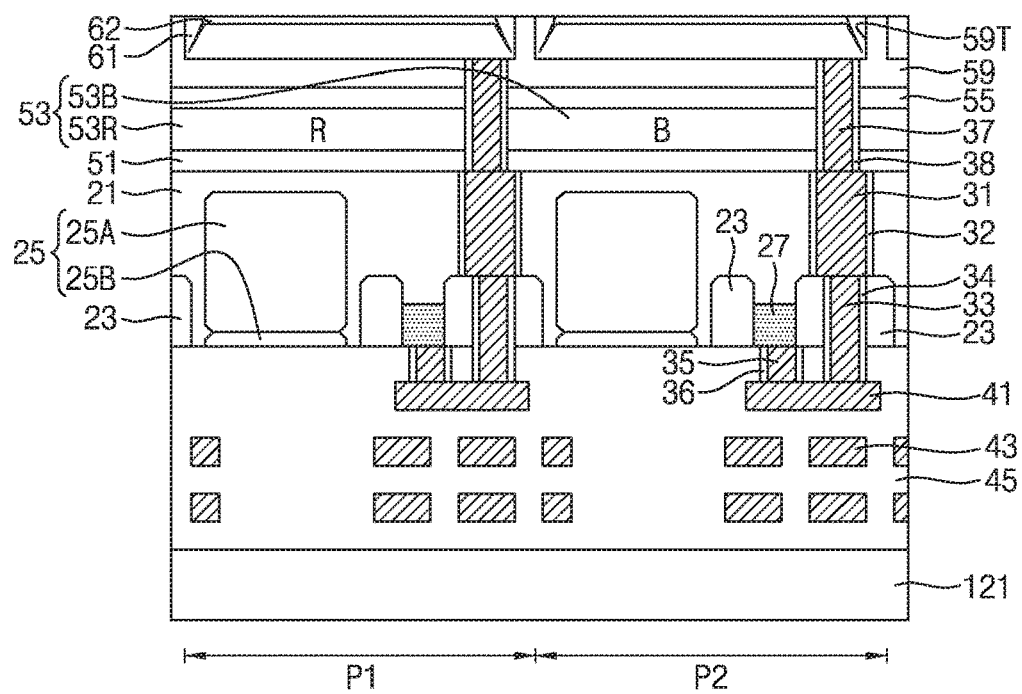

Referring to FIG. 16, upper ends of the isolation insulating pattern 59 may be exposed using a planarization process. The first layer 61 and the second layer 62 may be defined inside the plurality of trenches 59T. The planarization process may include a chemical mechanical polishing (CMP) process, an etchback process, or a combination thereof. Upper ends of the isolation insulating pattern 59, the first layer 61, and the second layer 62 may be exposed and substantially coplanar with each other.

Figure 17:
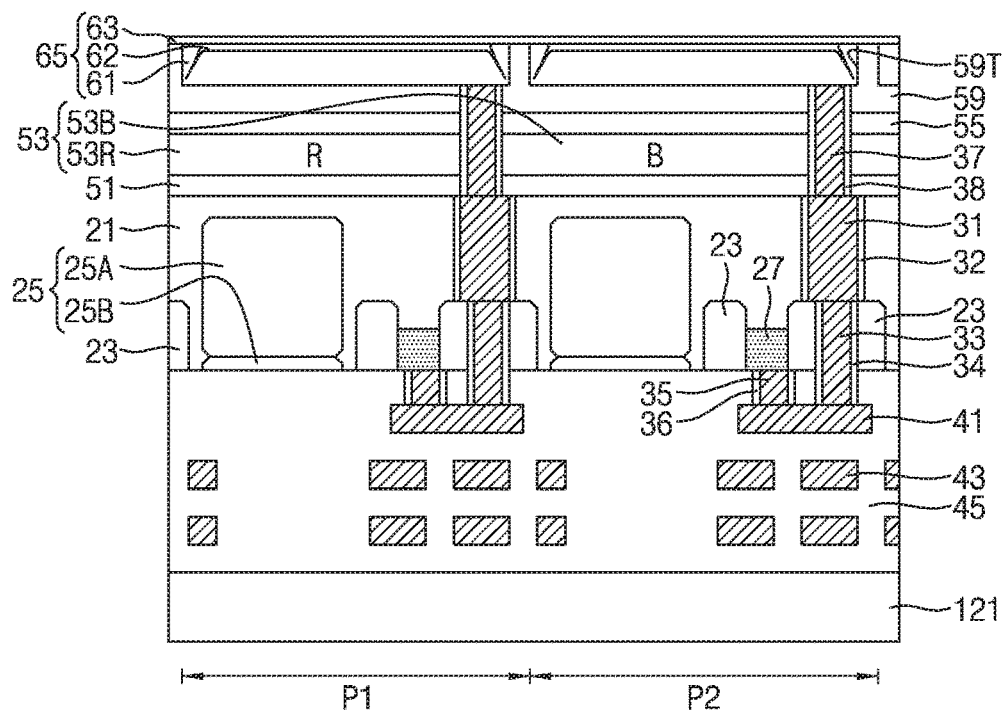

Referring to FIG. 17, a third layer 63 may be formed on top surfaces of the isolation insulating pattern 59, the first layer 61, and the second layer 62. The first layer 61, the second layer 62, and the third layer 63 may constitute a lower transparent electrode 65. The third layer 63 may be formed using a surface treatment process. For example, the third layer 63 may be formed using a plasma treatment process using $O_2$, $N_2O$, or a combination thereof. The third layer 63 may be formed using a wet treatment process using hydrogen chloride (HCl), an ultraviolet (UV) bake process, or a combination thereof.

In an embodiment, the third layer 63 may include the same elements as the second layer 62 and the first layer 61, and a percent by weight (wt %) of oxygen in the third layer 63 may be higher than the second layer 62. For example, the first layer 61 may include indium tin oxide (ITO), and the second layer 62 may include ITO containing a higher percent by weight (wt %) of oxygen than the first layer 61. The third layer 63 may include ITO containing a higher percent by weight (wt %) of oxygen than the second layer 62.

In an embodiment, the process of forming the third layer 63 may be omitted.

Figure 18:
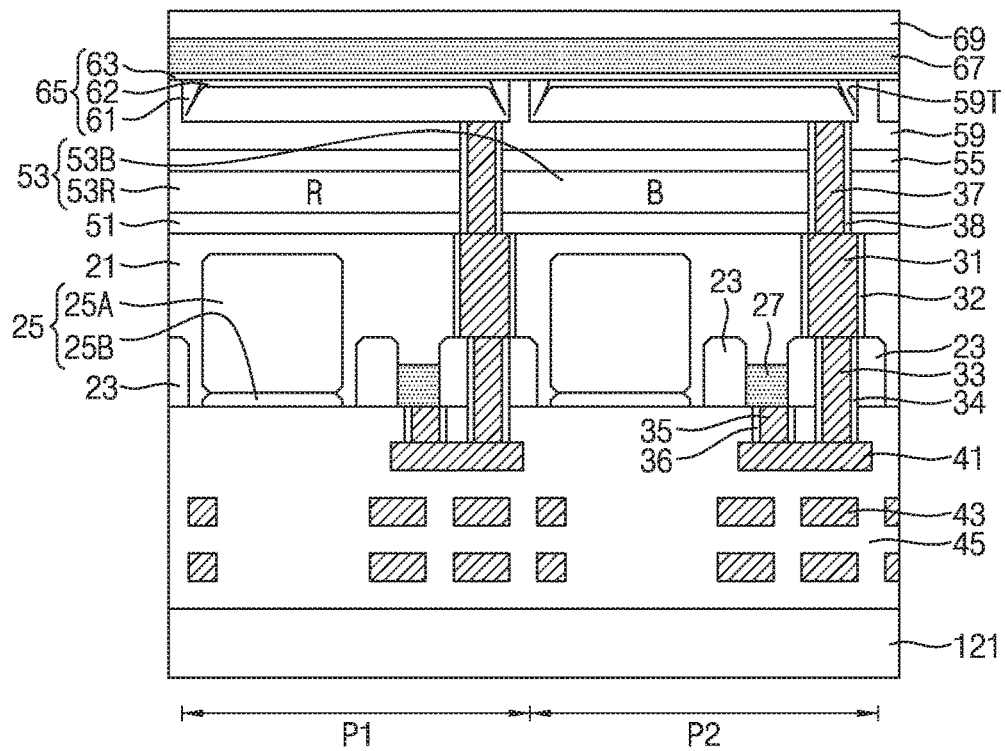

Referring to FIG. 18, an organic photoelectric layer 67 may be formed on the third layer 63. An upper transparent electrode 69 may be formed on the organic photoelectric layer 67.

The organic photoelectric layer 67 may include an organic material that selectively causes photoelectric conversion for light having a specific wavelength (or range of wavelengths). For example, the organic photoelectric layer 67 may include an organic material that absorbs light having a green wavelength and causes photoelectric conversion. The organic photoelectric layer 67 may include a P-type semiconductor compound layer, an N-type semiconductor compound layer, an intrinsic semiconductor compound layer, or a combination thereof. The P-type semiconductor compound layer may include N,N'-dimethyl-quinacridone (DMQA) and derivatives thereof, diindenoperylene, dibenzo{[f,f']-4,4',7,7'-tetraphenyl}diindeno[1,2,3-cd:1',2',3'-lm]perylene), or a combination thereof. The N-type semiconductor compound layer may include dicyanovinylterthiophene (DCV3T) and derivatives thereof, perylene diimide, phthalocyanine and derivatives thereof, subphthalocyanine and derivatives thereof, boron dipyrromethene (BODIPY) and derivatives thereof, or a combination thereof. The intrinsic semiconductor compound layer may include a P-type semiconductor compound and an N-type semiconductor compound which are mixed at a predetermined ratio.

The upper transparent electrode 69 may include a conductive oxide such as ITO, IZO, ZnO, SnO, TiO, AZO, GZO, FTO, ATO, or a combination thereof.

Referring back to FIG. 1, a fourth insulating layer 71 may be formed on the upper transparent electrode 69. The fourth insulating layer 71 may correspond to a protective layer. A plurality of microlenses 75 may be formed on the fourth insulating layer 71.

Figure 19:
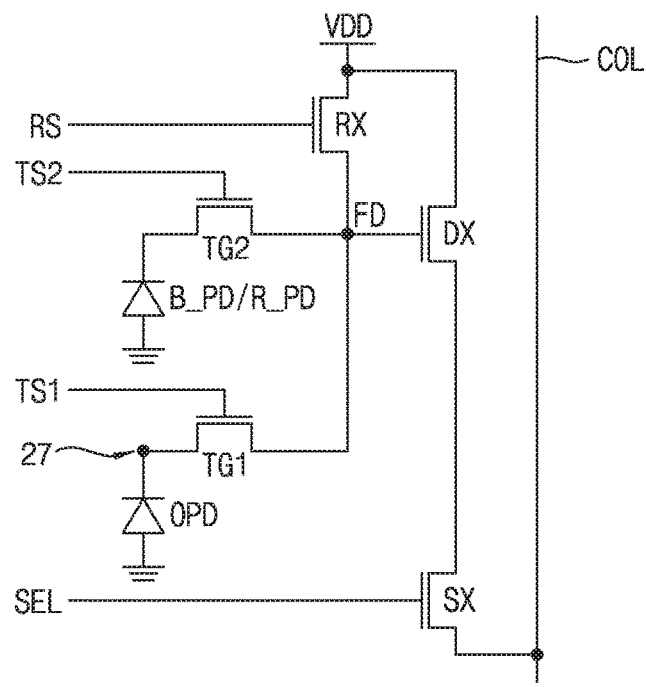
FIGS. 19 and 20 are circuit diagrams of a semiconductor image sensor according to embodiments of the inventive concept.
Figure 20:
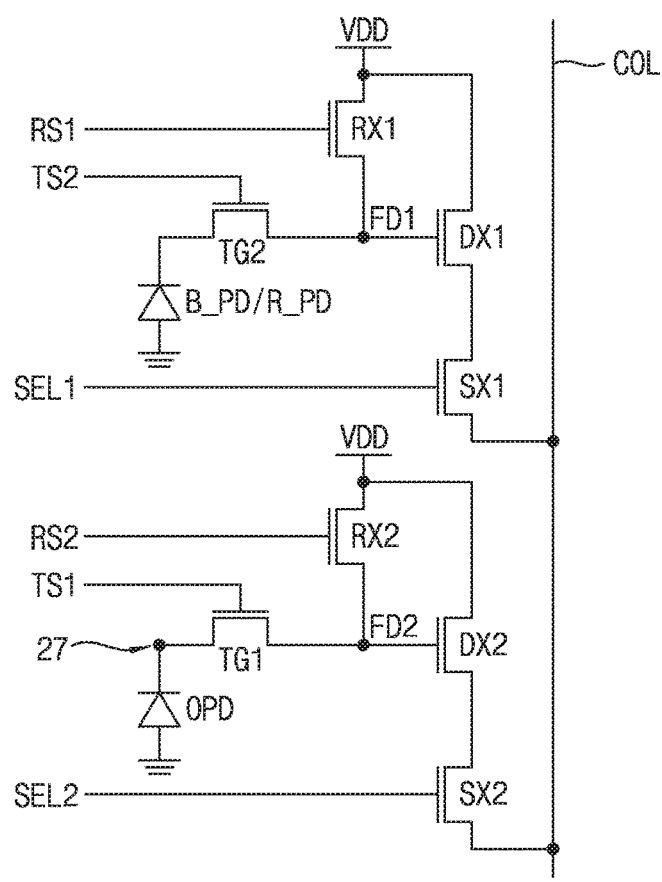

FIGS. 19 and 20 are circuit diagrams of a semiconductor device according to an embodiment of the inventive concept. In an embodiment, the circuit diagrams of the semiconductor device may illustrate equivalent circuits of portions of image sensors having an organic photoelectric conversion element OPD and a photoelectric conversion element B_PD/R_PD.

Referring to FIG. 19, an image sensor may include an organic photoelectric conversion element OPD, a photoelectric conversion element B_PD/R_PD, a node region 27, first and second transmission transistors TG1 and TG2, a floating diffusion region FD, a reset transistor RX, a drive transistor DX, and a selection transistor SX. A drain voltage VDD may be applied to one ends of the reset transistor RX and the drive transistor DX. The first transmission transistor TG1 may operate in response to a first transmission control signal TS1. The second transmission transistor TG2 may operate in response to a second transmission control signal TS2. The reset transistor RX may operate in response to a reset control signal RS. The selection transistor SX may operate in response to a selection control signal SEL.

The organic photoelectric conversion element OPD may be an organic photodiode. The organic photoelectric conversion element OPD may be an element configured to sense green. Electric charges generated by the organic photoelectric conversion element OPD may pass through the node region 27 and be transmitted to the floating diffusion region FD by the first transmission transistor TG1. The photoelectric conversion element B_PD/R_PD may be a photoelectric conversion element B_PD configured to sense blue or a photoelectric conversion element R_PD configured to sense red. Electric charges generated by the photoelectric conversion element B_PD/R_PD may be transmitted to the floating diffusion region FD by the second transmission transistor TG2. A signal corresponding to electric charges generated by the organic photoelectric conversion element OPD or the photoelectric conversion element B_PD/R_PD may be transmitted to a column line COL according to operations of the drive transistor DX and the selection transistor SX.

Referring to FIG. 20, an image sensor may include an organic photoelectric conversion element OPD, a photoelectric conversion element B_PD/R_PD, a node region 27, first and second transmission transistors TG1 and TG2, first and second floating diffusion regions FD1 and FD2, first and second reset transistors RX1 and RX2, first and second drive transistors DX1 and DX2, and first and second selection transistors SX1 and SX2. The first and second transmission transistors TG1 and TG2 may operate in response to first and second transmission control signals TS1 and TS2. The first and second reset transistors RX1 and RX2 may operate in response to first and second reset control signals RS1 and RS2. The first and second selection transistors SX1 and SX2 may operate in response to first and second selection control signals SEL1 and SEL2.

The electric charges generated by the organic photoelectric conversion element OPD may pass through the node region 27 and be transmitted to the second floating diffusion region FD2 by the first transmission transistor TG1. Electric charges generated by the photoelectric conversion element B_PD/R_PD may be transmitted to the first floating diffusion region FD1 by the second transmission transistor TG2. A signal corresponding to electric charges generated by the organic photoelectric conversion element OPD or the photoelectric conversion element B_PD/R_PD may be transmitted to the column line COL according to operations of the first and second drive transistors DX1 and DX2 and operations of the first and second selection transistors SX1 and SX2.

According to the example embodiments of the inventive concept, an isolation insulating pattern having a trench and a lower transparent electrode disposed within the trench can be provided. The lower transparent electrode can include a first layer and a second layer disposed on the first layer. Upper ends of the isolation insulating pattern, the first layer, and the second layer can be substantially coplanar with each other. The second layer can contain a higher percent by weight (wt %) of oxygen than the first layer. The second layer can have a larger work function than the first layer. The second layer can fill a seam formed in the first layer completely and densely. An image sensor advantageous for an increase in integration density and having excellent electrical characteristics can be implemented.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. An image sensor, comprising:
   a substrate;
   an isolation insulating pattern having a trench therein, on said substrate;
   a lower transparent electrode within the trench, said lower transparent electrode comprising a first layer and a different second layer on the first layer;
   an organic photoelectric layer on said lower transparent electrode;
   an upper transparent electrode on said organic photoelectric layer;
   a microlens on said upper transparent electrode;
   a photoelectric conversion element and a node region at spaced-apart locations in said substrate; and
   a color filter layer extending between said substrate and the isolation insulating pattern.

2. The sensor of claim 1, wherein portions of the isolation insulating pattern, the first layer, and the second layer are substantially coplanar with each other.

3. The sensor of claim 1, wherein the first layer contacts a bottom and a side surface of the trench.

4. The sensor of claim 3, wherein the first layer has a seam therein extending adjacent a corner of the trench, which is at least partially filled by a portion of the second layer.

5. The sensor of claim 1, wherein the first layer has a higher light transmission efficiency relative to the second layer and a lower electrical resistance relative to the second layer.

6. The sensor of claim 1, wherein the second layer comprises a material having a higher work function relative to the first layer.

7. The sensor of claim 6, wherein the second layer contains a higher percentage of oxygen, by weight, relative to the first layer.

8. The sensor of claim 1, wherein the first layer and the second layer comprise the same materials, but the second layer contains a higher percentage of oxygen, by weight, relative to the first layer.

9. The sensor of claim 1, wherein the first layer and the second layer comprise indium tin oxide; and wherein the indium tin oxide in the second layer has a higher percentage of oxygen therein relative to the first layer.

10. The sensor of claim 8, wherein said lower transparent electrode comprises a third layer disposed on the first and second layers; and wherein the third layer contains a higher percentage of oxygen, by weight, relative to the second layer.

11. The sensor of claim 10, wherein each of the first, second and third layers comprise indium tin oxide.

12. The sensor of claim 10, wherein a portion of the third layer in direct contact with the first layer is thicker than a portion of the third layer in direct contact with the second layer.

13. The sensor of claim 1, further comprising at least one contact plug, which passes through said color filter layer and electrically connects the node region with said lower transparent electrode.

14. The sensor of claim 1, wherein the first layer comprises a material selected from the group consisting of indium tin oxide, indium zinc oxide, zinc oxide, tin oxide, titanium oxide, aluminum-doped zinc oxide, gallium-doped zinc oxide, fluorine-doped tin oxide, and antimony-doped tin oxide.

15. The sensor of claim 14, wherein the second layer comprises a material having a higher work function relative to the first layer.

16. A semiconductor device comprising:
   an isolation insulating pattern disposed on a substrate and having a trench;
   a lower transparent electrode disposed inside the trench;
   an organic photoelectric layer disposed on the lower transparent electrode; and
   an upper transparent electrode disposed on the organic photoelectric layer;
   wherein the lower transparent electrode comprises a first layer, a second layer disposed on the first layer, and a third layer disposed on the first layer and the second layer;

wherein the third layer contains a higher weight percent of oxygen than the second layer; and wherein upper ends of the isolation insulating pattern, the first layer, and the second layer are substantially coplanar with each other.

17. The semiconductor device of claim 16, wherein the first layer comprises a material layer having relatively higher light transmission efficiency and a relatively lower electrical resistance than the second layer.

18. A semiconductor device comprising:
a plurality of photoelectric conversion elements disposed in a substrate;
a plurality of node regions disposed in the substrate and spaced apart from the plurality of photoelectric conversion elements;
a color filter layer disposed on the substrate;
an isolation insulating pattern disposed on the color filter layer and having a plurality of trenches;
a plurality of lower transparent electrodes disposed inside the plurality of trenches;
an organic photoelectric layer disposed on the plurality of lower transparent electrodes;
an upper transparent electrode disposed on the organic photoelectric layer; and
a plurality of microlenses disposed on the upper transparent electrode, wherein each of the plurality of lower transparent electrodes comprises a first layer and a second layer disposed on the first layer, and wherein upper ends of the isolation insulating pattern, the first layer, and the second layer are substantially coplanar with each other, and each of the plurality of lower transparent electrodes is connected to a corresponding one of the plurality of node regions through at least one contact plug disposed to pass through the color filter layer.

19. The semiconductor device of claim 18, wherein the color filter layer comprises:
a first color filter that is a red filter; and
a second color filter that is a blue filter and adjacent to the first color filter,
wherein the organic photoelectric layer comprises an organic material configured to absorb light having a green wavelength and cause photoelectric conversion.

20. The semiconductor device of claim 18, wherein the at least one contact plug passes through the isolation insulating pattern and is in direct contact with the first layer.

* * * * *